(12) United States Patent
Bhushan et al.

(10) Patent No.: US 7,512,509 B2
(45) Date of Patent: Mar. 31, 2009

(54) M1 TESTABLE ADDRESSABLE ARRAY FOR DEVICE PARAMETER CHARACTERIZATION

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/740,538

(22) Filed: Apr. 26, 2007

(65) Prior Publication Data

US 2008/0270064 A1 Oct. 30, 2008

(51) Int. Cl.
*G06F 19/00* (2006.01)
(52) U.S. Cl. ...................... 702/118; 702/119
(58) Field of Classification Search .......... 702/117, 702/118; 365/185.23, 185.24; 324/763, 324/765; 257/686, 785; 438/110, 116
See application file for complete search history.

(56) References Cited

U.S. PATENT DOCUMENTS

| 4,712,192 | A | * | 12/1987 | Tanimura et al. ............ 365/51 |
| 5,038,349 | A | | 8/1991 | Lipp |
| 5,793,675 | A | | 8/1998 | Cappelletti et al. |
| 5,903,059 | A | * | 5/1999 | Bertin et al. ............... 257/785 |
| 5,951,702 | A | | 9/1999 | Lim et al. |
| 6,128,219 | A | | 10/2000 | Pio et al. |
| 6,403,389 | B1 | | 6/2002 | Chang et al. |
| 6,577,149 | B2 | | 6/2003 | Doong et al. |
| 7,050,343 | B2 | | 5/2006 | Kumar et al. |
| 7,336,540 | B2 | * | 2/2008 | Ng et al. ................... 365/185.2 |
| 2006/0022695 | A1 | | 2/2006 | Barish et al. |

OTHER PUBLICATIONS

S. Saxena et al., "Test Structures and Analysis for Estimation of the Impact of Layout on MOSFET Performance and Variability," Proc. IEEE 2004 Int. Conference on Microelectronic Test Structures, Mar. 2004, pp. 263-266, vol. 17.
T. Mizuno et al., "Experimental Study of Threshold Voltage Fluctuations Using an 8K MOSFET's Array," Symp. VLSI Tech. Digest, 1993, pp. 41-42.
K. Agarwal et al., "A Test Structure for Characterizing Local Device Mismatches," Symp. VLSI Tech., 2006, 2 pages.
U. Schaper et al., "Parameter Variation on Chip-Level," Proc. IEEE 2005 Int. Conference on Microelectronic Test Structures, Apr. 2005, pp. 155-158, vol. 18.
K.Y.Y. Doong et al., "Field-Configurable Test Structure Array (FC-TSA): Enabling Design for Monitor, Model and Manufacturability," Proc. IEEE 2006 Int. Conference on Microelectronic Test Structures, 2006, pp. 98-103.

* cited by examiner

*Primary Examiner*—Bryan Bui
(74) *Attorney, Agent, or Firm*—Ido Tuchman; Ryan, Mason & Lewis, LLP

(57) ABSTRACT

An integrated circuit device and device parameter characterization method are provided. The integrated circuit device has a padset with plurality of pads. The integrated circuit device also includes one or more arrays of devices under test, each of the one or more arrays disposed between two of the plurality of pads. The integrated circuit device further includes one or more n-bit decoders, each disposed between two of the plurality of pads and electrically coupled to a corresponding one of the one or more arrays. Each n-bit decoder comprises one or more outputs that deliver a defined voltage to each device under test in the corresponding one of the one or more arrays of devices under test. The integrated circuit device and corresponding electrical connections are implemented in a single level of metal.

20 Claims, 15 Drawing Sheets

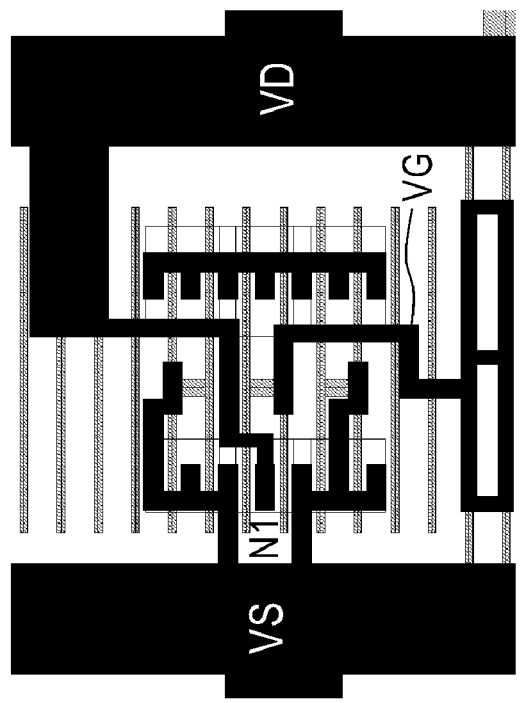
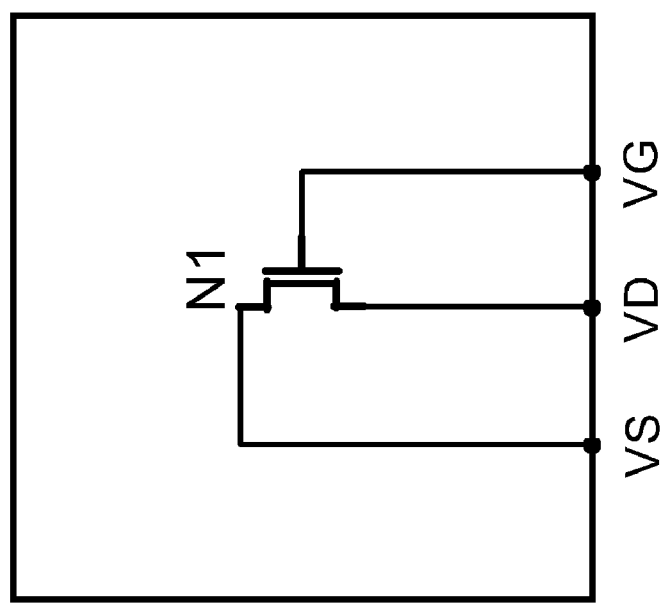
FIG. 3B
FIG. 3A

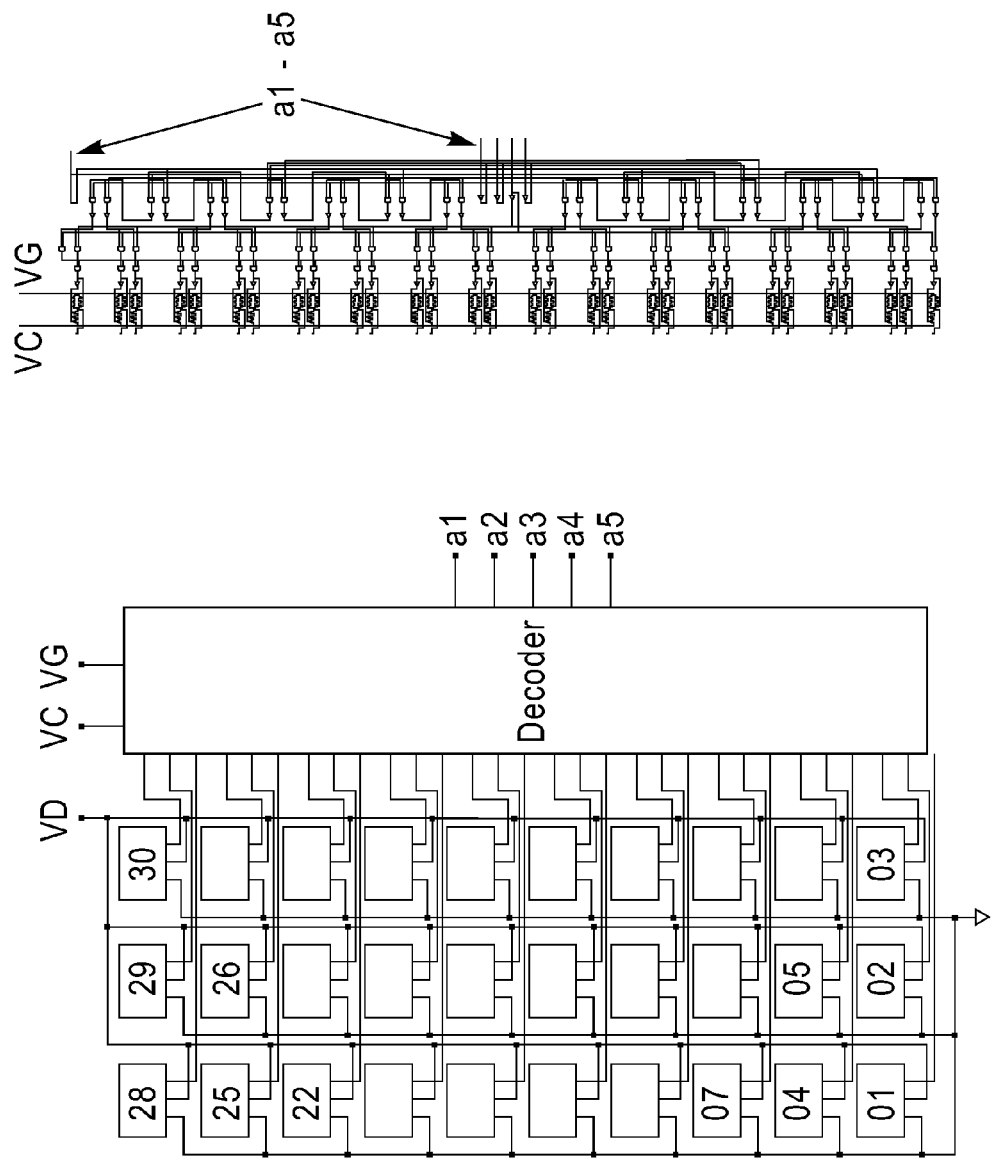

| Bit | a5 | a4 | a3 | a2 | a1 | Out |
|---|---|---|---|---|---|---|
| 0 | 0 | 0 | 0 | 0 | 0 | All "0" |
| 1 | 0 | 0 | 0 | 0 | 1 | O01 |
| 2 | 0 | 0 | 0 | 1 | 0 | O02 |
| 3 | 0 | 0 | 0 | 1 | 1 | O03 |
| 4 | 0 | 0 | 1 | 0 | 0 | O04 |
| 5 | 0 | 0 | 1 | 0 | 1 | O05 |
| 6 | 0 | 0 | 1 | 1 | 0 | O06 |
| 7 | 0 | 0 | 1 | 1 | 1 | O07 |
| 8 | 0 | 1 | 0 | 0 | 0 | O08 |
| 9 | 0 | 1 | 0 | 0 | 1 | O09 |
| 10 | 0 | 1 | 0 | 1 | 0 | O10 |
| 11 | 0 | 1 | 0 | 1 | 1 | O11 |
| 12 | 0 | 1 | 1 | 0 | 0 | O12 |
| 13 | 0 | 1 | 1 | 0 | 1 | O13 |
| 14 | 0 | 1 | 1 | 1 | 0 | O14 |
| 15 | 0 | 1 | 1 | 1 | 1 | O15 |
| 16 | 1 | 0 | 0 | 0 | 0 | O16 |
| 17 | 1 | 0 | 0 | 0 | 1 | O17 |
| 18 | 1 | 0 | 0 | 1 | 0 | O18 |
| 19 | 1 | 0 | 0 | 1 | 1 | O19 |
| 20 | 1 | 0 | 1 | 0 | 0 | O20 |
| 21 | 1 | 0 | 1 | 0 | 1 | O21 |
| 22 | 1 | 0 | 1 | 1 | 0 | O22 |
| 23 | 1 | 0 | 1 | 1 | 1 | O23 |
| 24 | 1 | 1 | 0 | 0 | 0 | O24 |
| 25 | 1 | 1 | 0 | 0 | 1 | O25 |
| 26 | 1 | 1 | 0 | 1 | 0 | O26 |
| 27 | 1 | 1 | 0 | 1 | 1 | O27 |
| 28 | 1 | 1 | 1 | 0 | 0 | O28 |
| 29 | 1 | 1 | 1 | 0 | 1 | O29 |
| 30 | 1 | 1 | 1 | 1 | 0 | O30 |
| 31 | 1 | 1 | 1 | 1 | 1 | All "1" |

FIG. 7

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|
| VDD | V1 | GND | V2 | VGA | VCA | V3 | GND | V4 | a1 | a2 | a3 | a4 | a5 | Vb5 | V5 | GND | V6 | VGB | VCB | V7 | GND | V8 | VDD | B1 |

FIG. 9

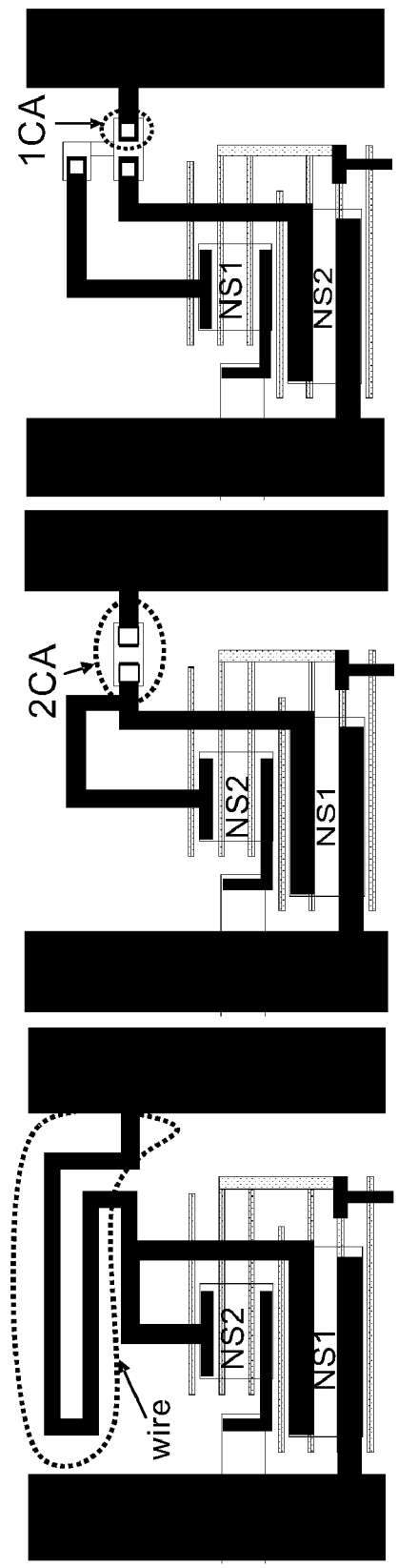

| 1 | VDD |
| --- | --- |
| 2 | VO1 |
| 3 | V1 |
| 4 | GND |
| 5 | V2 |
| 6 | VO2 |
| 7 | VCA |
| 8 | VO3 |
| 9 | V3 |
| 10 | GND |
| 11 | V4 |
| 12 | VO4 |
| 13 | a1 |
| 14 | a2 |
| 15 | a3 |
| 16 | a4 |
| 17 | a5 |
| 18 | VCB |
| 19 | VO5 |
| 20 | V5 |
| 21 | GND |
| 22 | V6 |
| 23 | VO6 |
| 24 | VDD |
| 25 | B1 |

FIG. 14

M1 TESTABLE ADDRESSABLE ARRAY FOR DEVICE PARAMETER CHARACTERIZATION

FIELD OF THE INVENTION

The present invention relates generally to integrated circuit devices and, more particularly, to a linear addressable array for characterizing device parameters in an integrated circuit device.

BACKGROUND OF THE INVENTION

As CMOS technology is scaled into the deep sub-100 nm regime, random variability of important device parameters is becoming of increasing concern. Variation of threshold voltage (Vt) of small static random access memory (SRAM) field effect transistors (FETs) is a prime example of such a concern since at the 45 nm technology node the standard deviation can exceed 50 mV. Metal to silicon contacts provide another example in which the mean and the variance of the contact resistance R(CA) are both becoming significant on the scale of the switching resistance of representative logic gates. Both the mean values and variances of important technology parameters must be characterized on a regular basis throughout the life cycle of a technology. The most straightforward way of accomplishing such characterizations is to measure a large enough number of nominally identical test structures to obtain mean values and variances to an adequate level of confidence.

Using FET characterization as an example, there are presently two common approaches for acquiring data on large numbers of FETs. The first is a brute force, single metal level (M1), approach in which, for example, 14-20 FETs are wired up in a single minimum sized 1×25 padset macro, which is then repeated multiple times. This approach is extremely inefficient from a real estate perspective. Further, the spatial extent of the collection of FETs is several millimeters, and care must be taken to subtract out any spatial variations that may be convolved with the statistical variations under study. Advantageously, in this approach the FETs can be unambiguously and individually measured and characterized with no voltage or current corrections required.

The second approach utilizes a large addressable array, typically measurable at fourth metal level (M4) or above. See, for example, T. Mizuno et al., "Experimental Study of Threshold Voltage Fluctuations Using an 8 k MOSFET Array," Symp. VLSI Tech. Digest, p. 41 (1993); U. Schaper et al., Parameter Variation on Chip Level," Proceedings of the IEEE International Conference on Microelectronics Test Structures, pp. 155-158 (2005); and K. Agarwal et al., "A Test Structure for Characterizing Local Device Mismatches," Symp. VLSI Tech., pp. 82-83 (2006). There may be several tens of thousands of FETs or more in a single macro. These designs are often single port, although multiport versions also exist. Test times tend to be long and voltage drop corrections due to series resistance and current corrections due to parallel leakage paths must be carefully made and ultimately limit the accuracy of the measurements and/or the range of current/voltage (IV) space over which accurate measurements can be made.

Wiring up an addressable array typically requires many low to moderately low resistance wiring tracks in both X and Y directions. An entire test chip of approximately 32 mm×25 mm in size has been demonstrated, using only M1, with such arrays in a two dimensional configuration (of order 100), where each array contained about 300 devices under test (DUTs). See K. Y. Doong et al., "Field-Configurable Test Structure Array (FC-TSA): Enabling Design for Monitor, Model and Manufacturability," Proceedings of the IEEE International Conference on Microelectronics Tests Structures, pp. 98-103 (2006). Crossovers are wired with relatively high resistance silicided polysilicon (PC) or diffusion (RX) areas. A large area for this design was required to wire everything up in an acceptably low resistance fashion and the arrays were not of a form factor that would allow easy placement in the scribe line (kerf) of a product chip.

SUMMARY OF THE INVENTION

The present invention provides an M1 testable, one dimensional, multiport, addressable array and methods of use.

For example, in one aspect of the present invention, an integrated circuit device is provided with a padset having a plurality of pads. The integrated circuit device also includes one or more arrays of devices under test, each of the one or more arrays disposed between two of the plurality of pads. The integrated circuit device further includes one or more n-bit decoders, each disposed between two of the plurality of pads and electrically coupled to a corresponding one of the one or more arrays. Each n-bit decoder comprises one or more outputs that deliver a defined voltage to each device under test in the corresponding one of the one or more arrays of devices under test. The integrated circuit device and corresponding electrical connections are implemented in a single level of metal.

In additional embodiments of the present invention, the integrated circuit device may comprise source and drain buses shared by the devices under test in each of the one or more arrays in the single level of metal. The two of the plurality of pads between which each of the one or more arrays are disposed comprise a source pad electrically coupled to the source bus, and a drain pad electrically coupled to the drain bus. Further, the integrated circuit device may comprise a positive voltage supply bus that powers the one or more n-bit decoders in the single level of metal, wherein the voltage supply bus runs along a side of the padset. Additionally, the integrated circuit device may comprise at least one adjustable voltage bus electrically coupled to the n-bit decoder and devices under test of at least one of the one or more arrays for delivery of at least one defined voltage to one or more of the devices under test of the one or more arrays in the single level of metal. The integrated circuit device has no crossovers in paths requiring substantial current flow. Crossovers and wiring segments of PC and RX are possible in other paths where steady state voltage drops remain small and do not impair circuit operation.

In accordance with another aspect of the present invention, a method of characterizing device parameters of an integrated circuit device is provided. Each of one or more arrays of devices under test is contacted to a corresponding ground. Each of the one or more arrays is disposed between two of a plurality of pads in a padset. A voltage is applied to at least one of the two of the plurality of pads in the padset. An address at an n-bit decoder is set corresponding to at least one of the plurality of devices under test. Each n-bit decoder is disposed between the two of the plurality of pads in the padset and corresponds to one of the one or more arrays. The one or more arrays and the n-bit decoder are implemented in a single level of metal. An adjustable voltage is applied to the at least one of the plurality of devices under test. A parameter of the at least one device under test is measured at the at least one of the two of the plurality of pads in the padset.

The array designs of the present invention provide advantages that include: the ability to be measured at M1; 10-20× more space efficiency than DUT macros measurable at M1 while providing the same information with little if any loss in data integrity and comparable or better ease of use; and ability to directly leverage high throughput parallel test capability.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3(a) is a circuit diagram illustrating an nFET, according to an embodiment of the present invention;

FIG. 3(b) is a diagram illustrating a DUT consisting of a FET wired out from a ring oscillator stage, according to an embodiment of the present invention;

FIG. 4(a) is a top level circuit diagram illustrating the arrangement of FIGS. 1. and 2, according to an embodiment of the present invention;

FIG. 4(b) is a circuit diagram of a decoder, according to an embodiment of the present invention;

FIG. 7 is a table of binary addresses of the DUTs, according to an embodiment of the present invention;

FIG. 9 is a table of macro pad assignments, according to an embodiment of the present invention;

FIG. 12(a) is a diagram illustrating a physical layout of a DUT where the object measured is a short segment of wire, according to an embodiment of the present invention;

FIG. 12(b) is a diagram illustrating a physical layout of a DUT where the object measured is two metal-to-RX contacts (CAs) in series, according to an embodiment of the present invention;

FIG. 12(c) is a diagram illustrating a physical layout of a DUT where the object measured is a single metal-to-RX contact (CA), according to an embodiment of the present invention;

FIG. 14 is a table of macro pad assignments, according to an embodiment of the present invention.

DETAILED DESCRIPTION OF PREFERRED EMBODIMENTS

The addressable array of the present invention is provided to improve the space efficiency of the brute force M1 testable approach by a factor of 10-20, while sacrificing very little in terms of measurement accuracy and ease of use. Designs for measuring both FET characteristics and the resistance of low resistance elements such as metal to silicon contacts, R(CA), are described. Circuit techniques are combined in a highly compact manner utilizing only one level of metal. This approach requires no correction for series voltage drop in the case of the FET array, and only a minimal measured correction in the case of the R(CA) array. Further, the approach requires only a minimal measured current correction at low currents for the FET array, while no current correction at all is required for the R(CA) array. The designs in 45 nm technology feature 240 FETs or 180 CA structures with 8 or 6 groups of 30, respectively. Each group is measurable independently, but also simultaneously with the others. The multiport design is especially attractive for parallel test approaches that allow for many measurements to go on in parallel at the same time. The macro size is of minimum allowable dimensions with a 1×25 padset.

Figure 1:
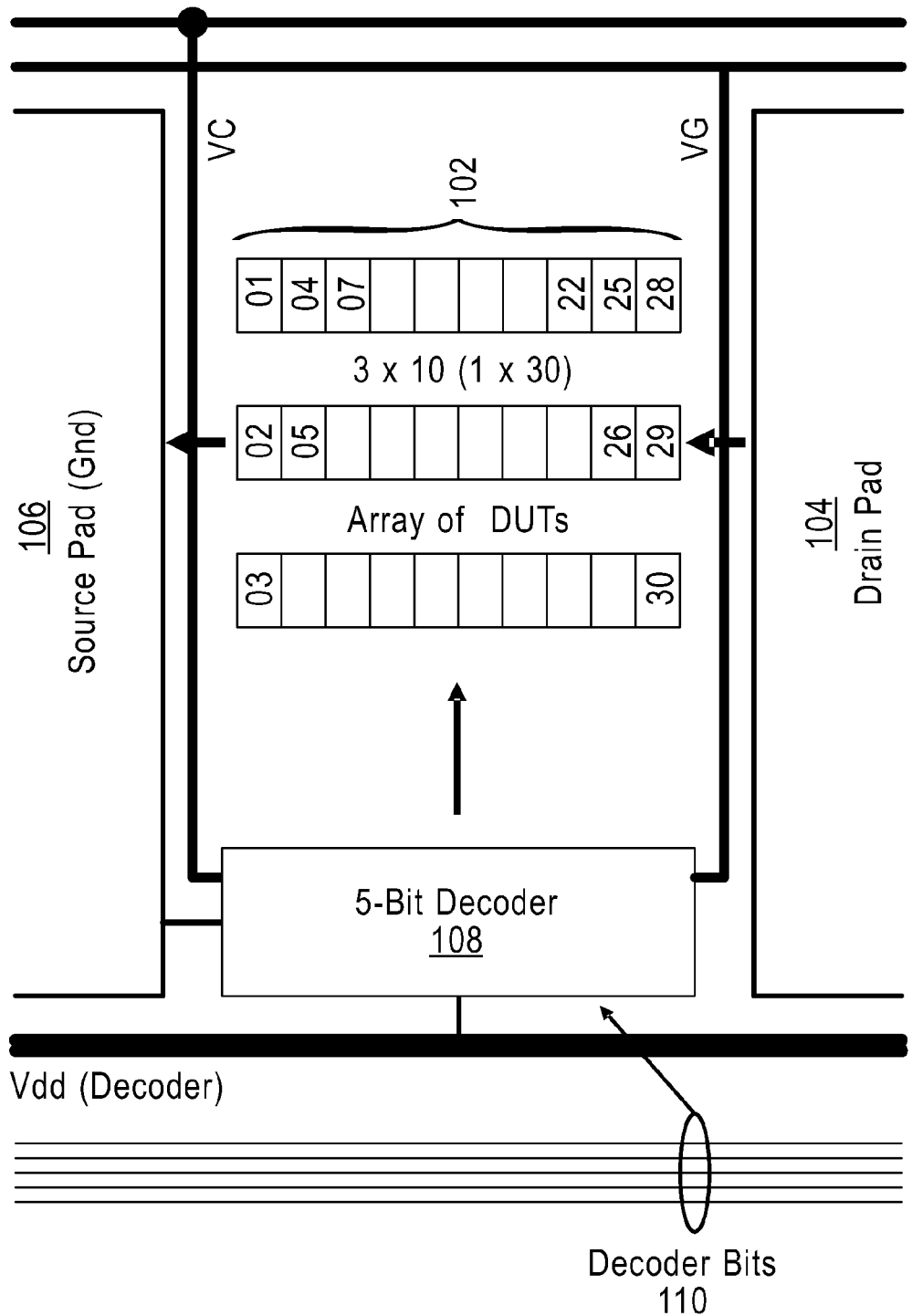
FIG. 1 is a diagram illustrating an M1 testable array of FETs, according to an embodiment of the present invention.
Figure 2:
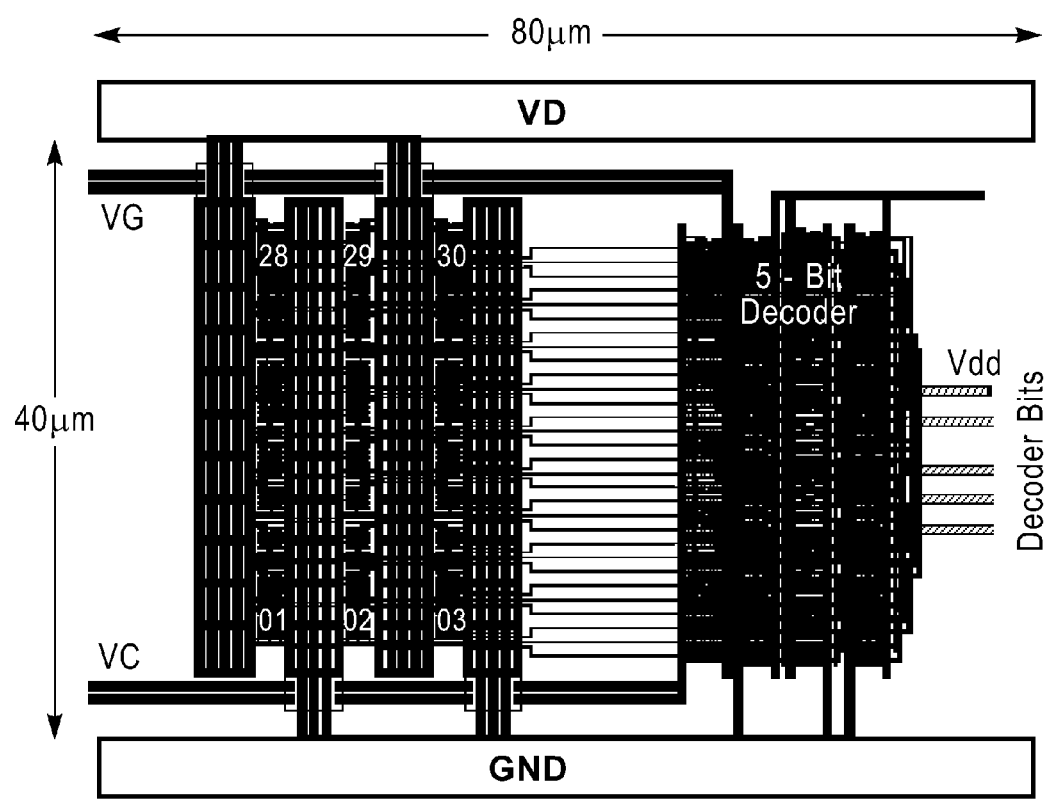
FIG. 2 is a diagram illustrating a physical layout of an M1 testable array of FETs, according to an embodiment of the present invention.

Referring initially to FIG. 1, a diagram illustrates an M1 testable array of FETs, according to an embodiment of the present invention. A corresponding physical layout is shown in FIG. 2. A 3×10 array (electrically a 1×30 array) of DUTs 102 is positioned in the 40 um gap between two 60 um×60 um pads of a conventional 1×25 padset, more specifically between a drain pad 104 and a source pad (ground) 106. Also situated between these pads is a 5-bit decoder 108. For the case where the DUTs are nFETs as shown in FIG. 2, the decoder outputs select 1 of the 30, all of them in parallel, or none of them, by applying an adjustable voltage of VG to the gate of the selected DUT(s) and a second adjustable voltage VC to the gates of the unselected DUTs. The nFETs share common source and drain busses configured as interdigited combs emanating from the adjacent source and drain pads. The drain current, which may be a maximum on the order of 1-2 mA, thus flows to and from the nearby source and drain pads 104, 106 through wide wires, much as if only a single nFET were situated between the pads. The Vdd bus that services the decoder runs along the right hand side of the pads along with the five decoder bit lines 110. The VG and VC busses run along the left hand side of the pads. Electrical crossovers are accomplished with silicided polysilicon (PC) or diffusion (RX) underpasses.

Referring now to FIG. 3(a) a diagram illustrates an nFET as the DUT, according to an embodiment of the present invention. With some minor modifications the array circuitry pFET DUTs can be accommodated as well. In the present 45 nm designs, DUTs are 12 PC pitches in height so that, for example, ring oscillator stages of interest can be plugged in and individual FETs wired up. Referring now to FIG. 3(b), a diagram illustrates such a stage, according to an embodiment of the present invention. The DUT space is also large enough to accommodate a small memory cell array that can be configured with one of the SRAM FETs wired up.

Referring now to FIG. 4(a) a top level circuit diagram illustrates the arrangement of FIGS. 1 and 2, according to an embodiment of the present invention. The figure provides more detail on how the array is wired up. Electrically this is a one-dimensional array with 30 single-element columns constituting a single row. The DUT selection is accomplished entirely via leads from the decoder to the gates of the DUTs. No series transmission gates are necessary in the columns, which eliminates an important voltage drop that must be corrected for in standard two-dimensional array designs.

Figure 5:
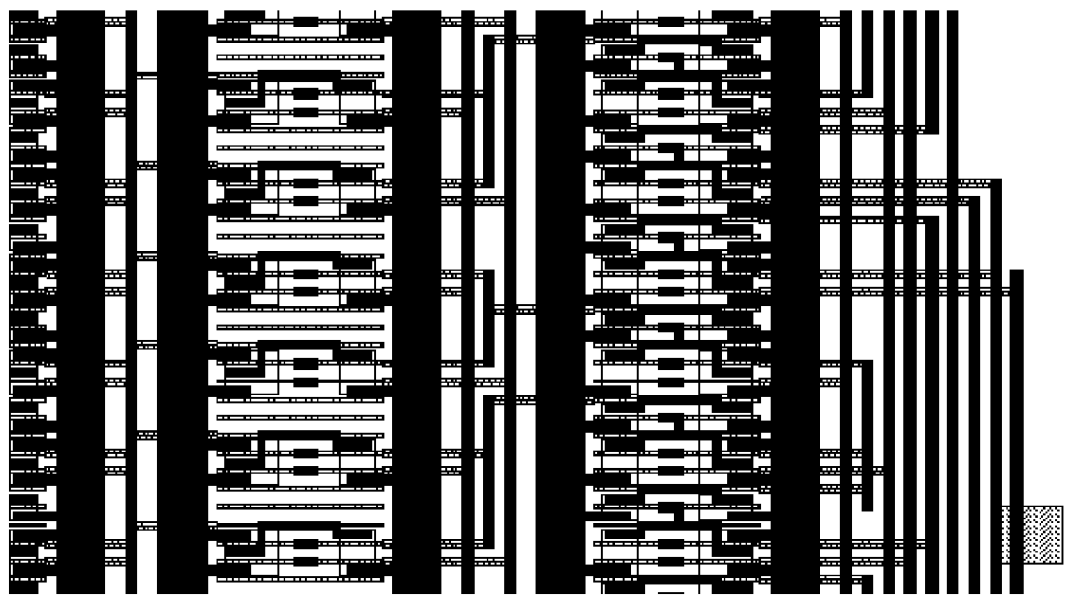
FIG. 5 is a diagram illustrating a physical layout of a decoder, according to an embodiment of the present invention.

The number of DUTs is limited by the size of the decoder that can be situated between the pads and wired using just one level of metal. FIG. 4(b) is a circuit diagram of the decoder, according to an embodiment of the present invention. FIG. 5 is a diagram illustrating the physical layout of the decoder, according to an embodiment of the present invention. The data flows predominately horizontally along the direction of the gate polysilicon (PC), with vertical M1 wiring tracks provided in regions between the bisected power busses. While this configuration does add considerable resistance to the decoder interconnections, it is of no consequence since the decoder must function on the 1-10 μs scale, not the sub-ns scale. The decoder is made up of high Vt inverters and two-way NAND gates (NAND2s) and is powered by the Vdd bus running to the right of the pads as previously described. The ground is common with the array. The Vdd bus can have a resistance of over 100 Ω for the array most remote from the Vdd pad. This is tolerable since while the voltage may drop considerably during the assertion of a new address, in the end there is only a single final state that is possible, and this will be achieved on the μs or faster timescale as the circuit settles down with an off current on the order of a μA. The bitlines are driven by pads in the center of the macro and service a number of decoders in parallel.

Figure 6A:
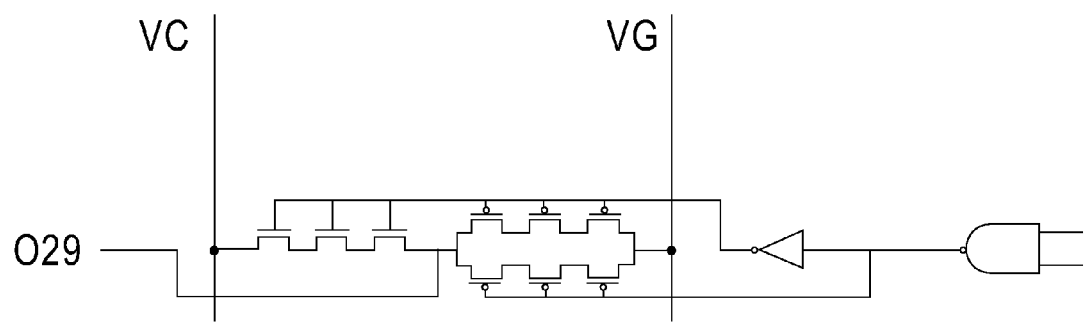
FIG. 6(a) is a circuit diagram illustrating select circuits, according to an embodiment of the present invention.
Figure 6B:
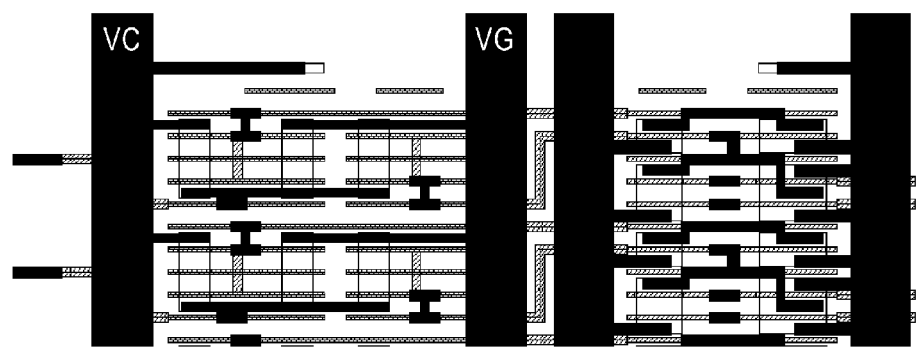
FIG. 6(b) is a diagram illustrating a physical layout of select circuits, according to an embodiment of the present invention.
Figure 8:
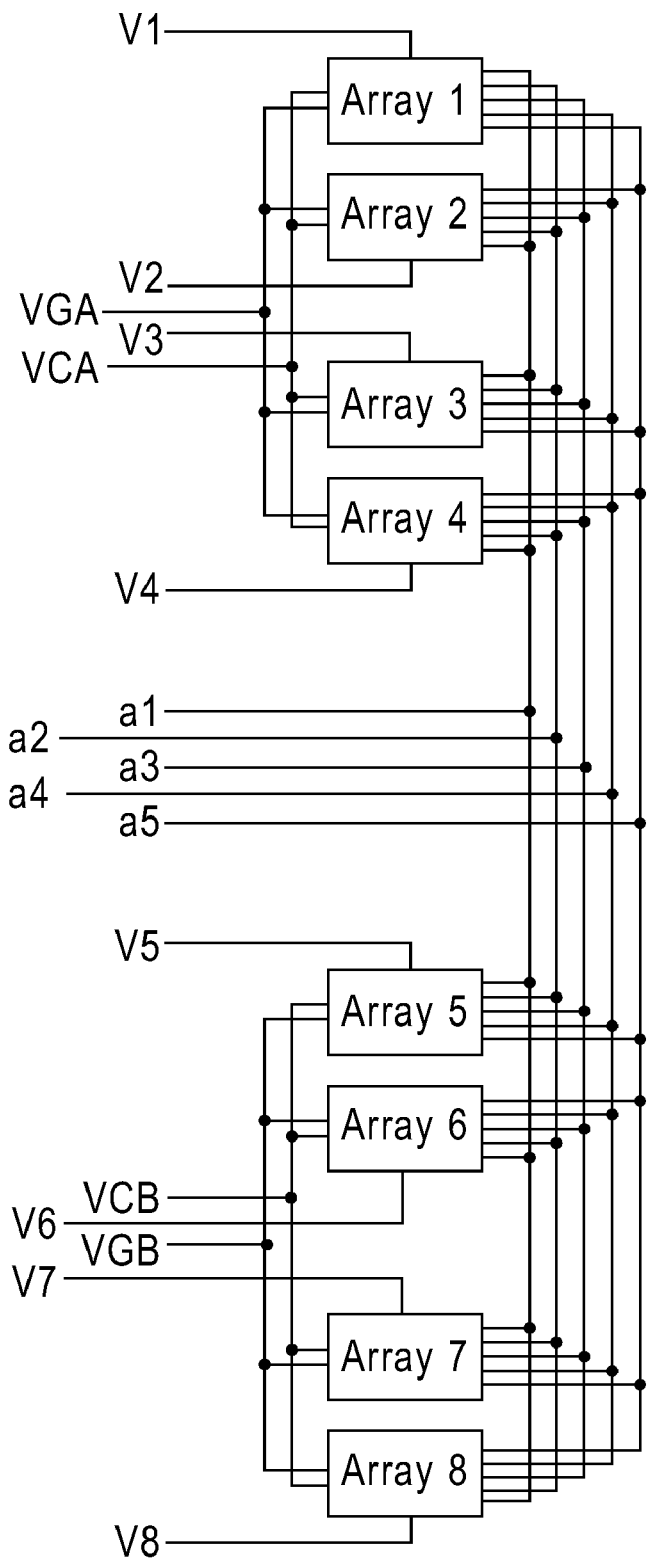
FIG. 8 is a top level circuit diagram of a macro accommodating eight arrays of 30 FETs each, according to an embodiment of the present invention.

The outputs of the decoder drive select circuits that in turn deliver VC or VG to the gates of the DUTs. Referring now to FIG. 6(a), a circuit diagram illustrates the select circuits, according to an embodiment of the present invention. FIG. 6(b) is a diagram illustrating the physical layout of the select circuits, according to an embodiment of the present invention. The off currents through the select circuits are reduced by using groups of three high Vt passgates in series rather than single passgates. These currents, while low, are of some concern because they ultimately flow through the VG and VC supply lines. Any voltage drop in the VG line is directly reflected as an error in the VG applied to the DUTs. The same VG bus addresses four arrays and utilizes resistive underpasses to cross the VD busses evident in FIGS. 1 and 2. By keeping the off currents low and taking care with the VG bus design, the VG bus voltage drop can be kept below 1 mV. The select circuits shown in FIG. 8 are for nFET DUTs where the negative clamp voltage VC is anticipated to be about −0.1V (the negative gate voltage that will give minimum drain current for unselected DUTs). In the case of pFET DUTs the select circuits are configured somewhat differently (nFET passgates swapped for pFET passgates) to allow for a positive VC, anticipated to be about 0.1V greater than the pFET source voltage.

Referring now to FIG. 7, a table illustrates binary addresses of the DUTs, according to an embodiment of the present invention. Note that with the DUT numbering convention as indicated in FIGS. 1, 2, and 4(a), a DUT's address is just its number expressed with bits a1-a5 in base 2, with a1 being the least significant bit. The address 00000 corresponds to no selected DUTs, more specifically all DUT gates are held at VC, while 111111 corresponds to having all DUT gates at VG. In the first case the background drain current with the gates of all DUTs at VC can be measured. In the second case the IV characteristics of the 30 DUTs in parallel can be precisely measured for drain currents of order 2 mA and less, allowing measurement of Ioff and Vt for the 30 DUTs in parallel.

Referring now to FIG. 8, a top level circuit diagram illustrates an FET macro accommodating 8 arrays of 30 DUTs each, according to an embodiment of the present invention. The present 45 nm design template is configured for nFET DUTs in arrays 1-4 and pFET DUTs in arrays 5-8. This can be easily reconfigured for all nFET or all pFET DUTs. Referring now to FIG. 9, a table shows the macro pad assignments, according to an embodiment of the present invention. These assignments for the most part correspond directly to the pins shown in FIG. 8. In all cases two arrays share a common ground pad. The pad #1 Vdd services decoders of arrays 1-4, while the pad #24 Vdd services decoders of arrays 5-8. Pad #15 is an extra that may become an additional decoder bit in a future design. In the present design it is named v5m and is hard-wired to the V5 bus of Array 5.

This macro can be measured one array at a time, or all eight arrays can be measured in parallel, depending on the capabilities of the tester and the existing test code. As previously mentioned, with low parasitic resistance in the drain-to-source path, no voltage correction in the IV characterization of an individual DUT will be required, even at currents on the order of Idsat, provided Idsat is on the order of 2 mA or less. At low currents, especially in the vicinity of Ioff, a current correction must be applied. This correction has a value that is approximately 29/30 times the current of the array with all DUTs at VC (address 00000). Assuming the drain current of the DUTs with gate at VC is 10× less than 0.1× Ioff, this approach should give Ioff values good to within about 5% of the true Ioff. More generally, if $\eta = I(00000)/I off(11111)$, then the Ioff of an individual DUT can be estimated as Ioff=(I(VG=0)−I(00000))/(1−η).

Figure 10:
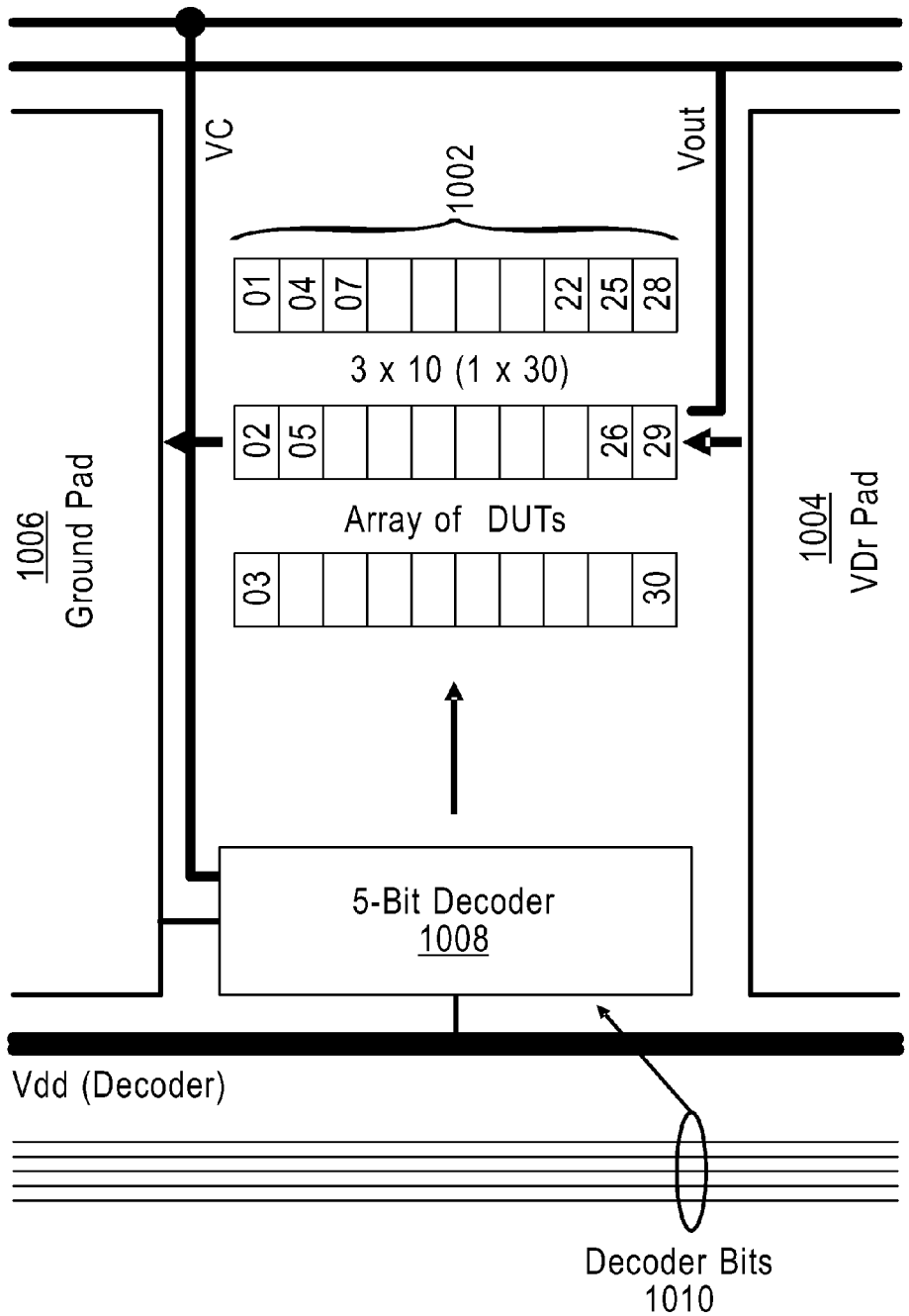
FIG. 10 is a diagram illustrating an M1 testable array for measuring resistance of silicon to metal contacts, according to an embodiment of the present invention.

Referring now to FIG. 10, a diagram illustrates an M1 testable array for measuring the resistance of silicon to metal contacts R(CA), according to an embodiment of the present invention. A 3×10 array of DUTs 1002 is disposed in the gap between a drive pad (VDr) 1004 and a ground pad 1006. A 5-bit decoder 1008 is also disposed between the pads. Five decoder bit lines 1010 run along the right hand side of the pads along with Vdd. This configuration closely resembles the FET array except that the adjustable VG bus is not required and now the actual voltage across each DUT, Vo, differs greatly from the voltage applied to the array, VDr, and must be directly read out.

Figure 11A:
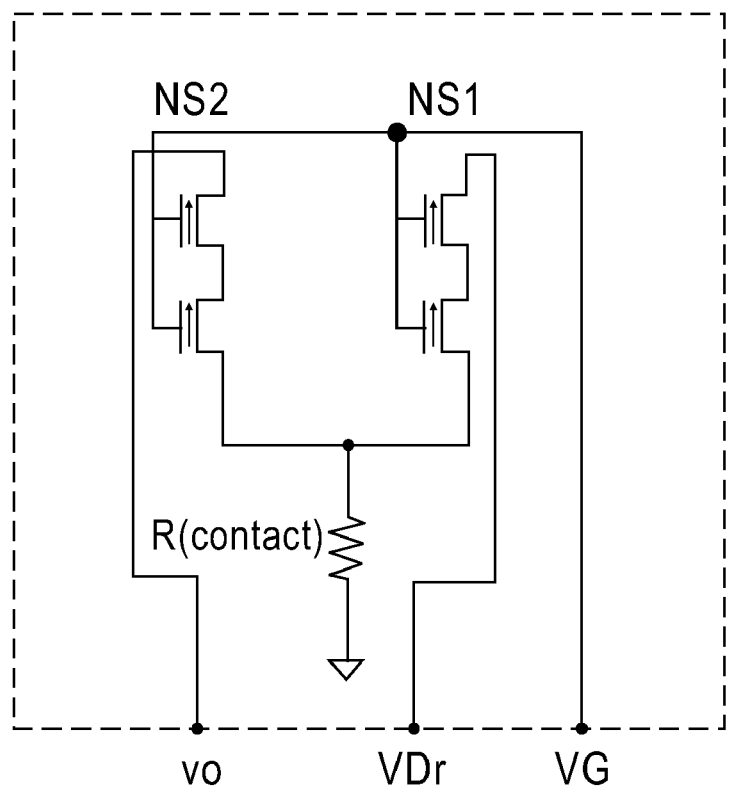
FIG. 11(a) is a circuit diagram illustrating a DUT of FIG. 10, according to an embodiment of the present invention.
Figure 11B:
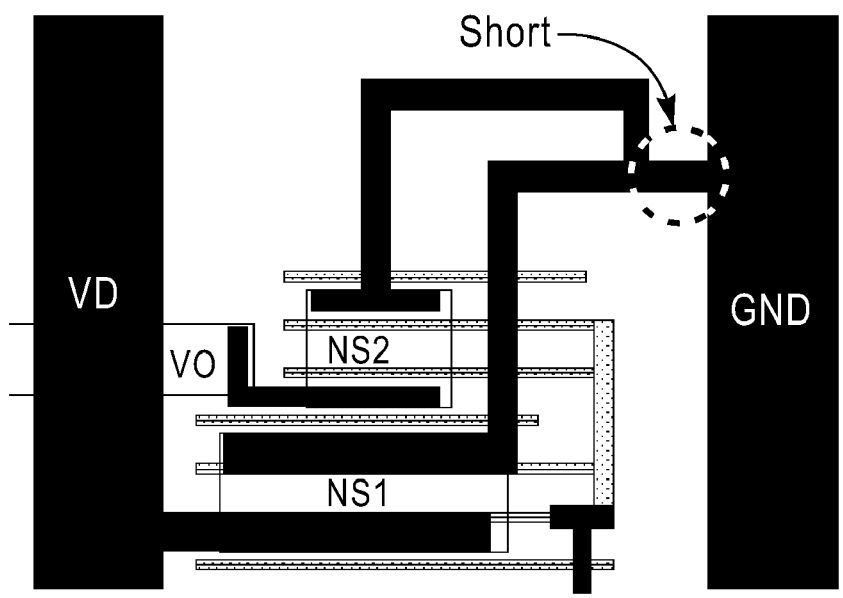
FIG. 11(b) is a diagram illustrating a physical layout of a DUT where the object measured is a metal short, according to an embodiment of the present invention.

Referring now to FIG. 11(a), a circuit diagram illustrates a DUT, according to an embodiment of the present invention. The VG input from the decoder is now at either the Vdd of the decoder or at VC. When selected, the resistive DUT is connected to the VDr drive pad through the series pair of passgates NS1 and read out as v0 with a high impedance voltmeter through the second set of series passgates NS2. FIG. 11(b) is a diagram illustrating a physical layout of a DUT where the object measured is a metal short, according to an embodiment of the present invention. FIG. 12(a) is a diagram illustrating a physical layout of a DUT where the object measured is a short segment of wire, according to an embodiment of the present invention. FIG. 12(b) is a diagram illustrating a physical layout of a DUT where the object measured is two metal to RX CA contacts in series, according to an embodiment of the present invention. FIG. 12(c) is a diagram illustrating a physical layout of a DUT where the object measured is a single metal to RX contact, according to an embodiment of the present invention.

Figures 13A, 13B:
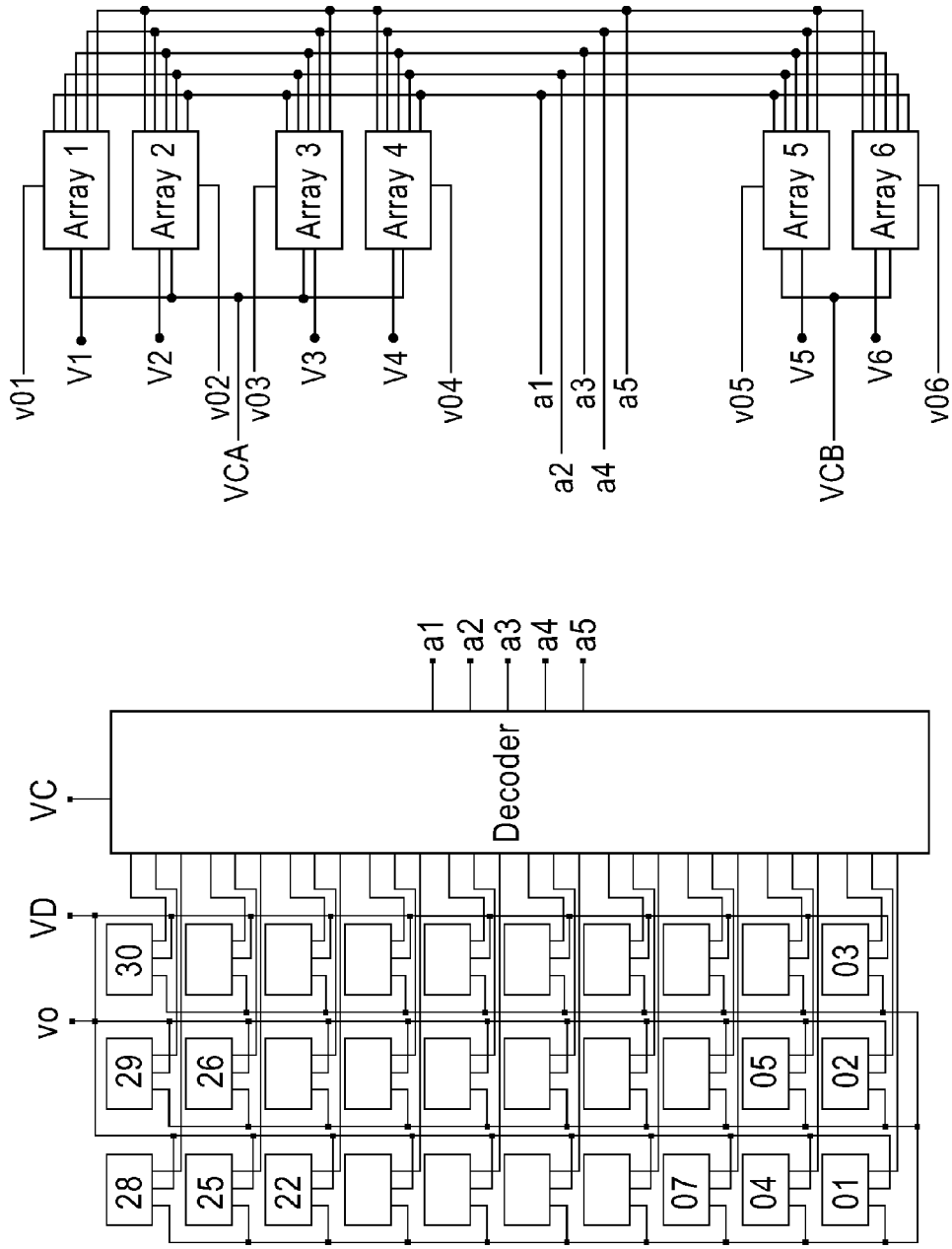
FIG. 13(a) is a top level circuit diagram illustrating the arrangement of FIG. 10, according to an embodiment of present invention.
FIG. 13(b) is a top level circuit diagram of a macro accommodating 6 arrays of 30 DUTs each, according to an embodiment of the present invention.

Referring now to FIG. 13(a), a top level circuit diagram illustrates the arrangement of FIG. 10, according to an embodiment of the present invention. The decoder and select circuits are the same as for the nFET array, except that VG is replaced with the decoder Vdd. The DUT numbering convention and decoder address bit designations are the same as for the FET array. FIG. 13(b) is a top level circuit diagram of the macro accommodating 6 arrays of 30 DUTs each, according to an embodiment of the present invention. FIG. 14 is a table showing the macro pad assignments, according to an embodiment of the present invention. Note that there are only 6 arrays of 30 DUTs as opposed to 8 arrays in the corresponding FET macro. This is a result of the fact that each array requires its own individual Vo output pad, while in the case of the FET arrays four arrays share a common VG pad.

This macro can be measured one array at a time, or all six arrays can be measured in parallel, depending on the capabilities of the tester and the existing test code. These are essentially three terminal measurements in which the ground remains common. On the other hand, by positioning one or a few short DUTs in each array it is possible to get a value for the ground path resistance which can then be used to correct the measurements of the other DUTs, rendering what is essentially a full four-terminal measurement. With the negative bias clamp (VC) applied to the NS1 and NS2 gates of DUTs not being measured, the parallel leakage through the unaddressed DUTs is negligible compared with the current through the addressed DUT (of order Idsat of the NS1 passgates) so no current correction is required. With the ground path voltage correction mentioned above and for DUT resistances in the range of 1-200 Ω the accuracy in the resistance measurement should be of order 1 Ω and limited only by the accuracy of the ground path correction. By adding an additional addressable Vo lead (with the same address as other gates in the DUT) at the ground side of each DUT (costs and additional pad per array) or by adding an additional addressable Vo lead (with a different address than present Vo lead, which means only half as many DUTs per array), a design for true four terminal resistance measurements with 0.1 Ω or better resolution can be implemented.

Figure 15:
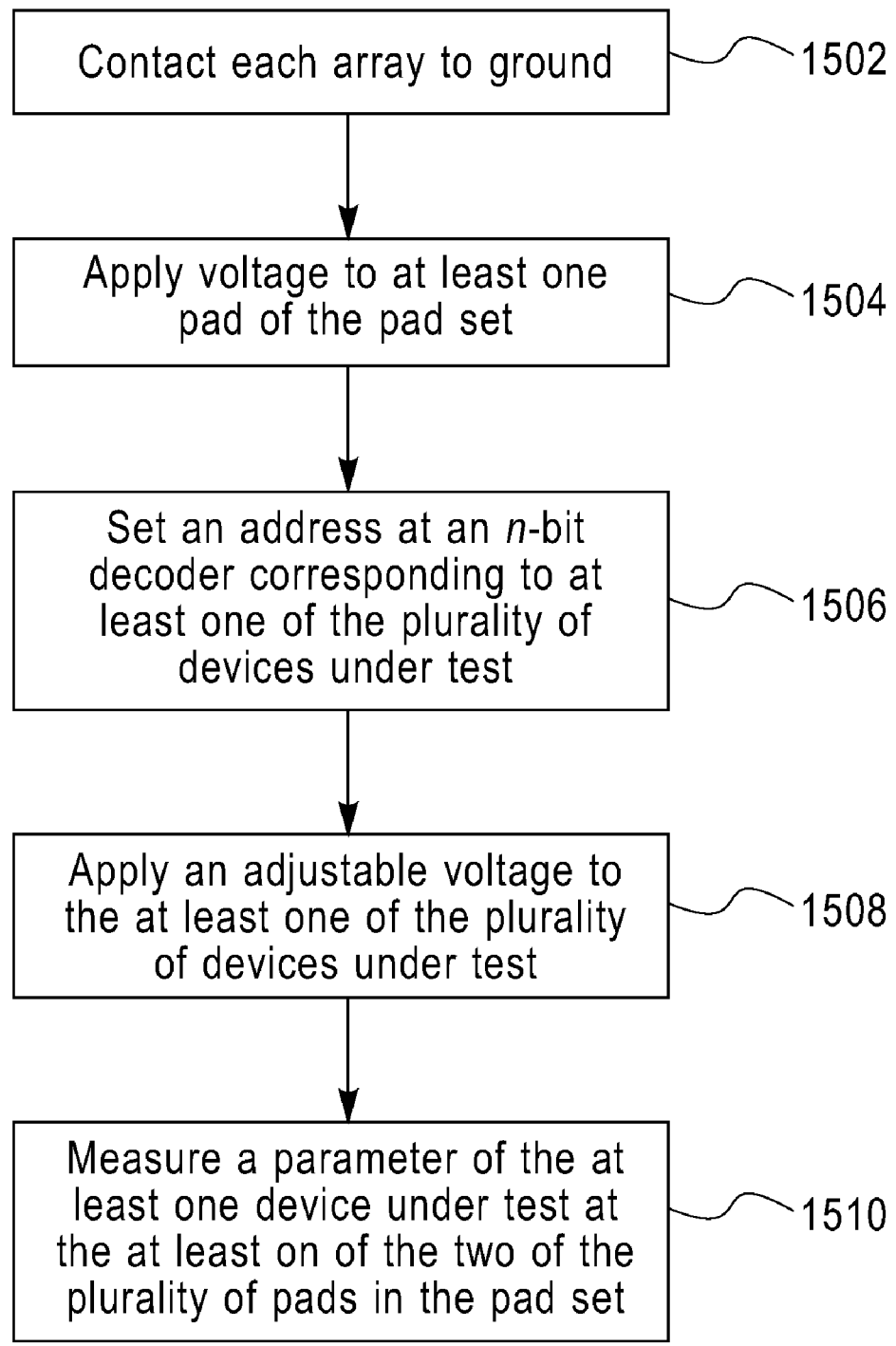
FIG. 15 is a flow diagram illustrating a device parameter characterization methodology in an integrated circuit device, according to an embodiment of the present invention.

Referring now to FIG. 15, a flow diagram illustrates a device parameter characterization methodology in an integrated circuit device, according to an embodiment of the present invention. In block 1502, each of one or more arrays of devices under test is first contacted to a corresponding ground. In block 1504, a voltage is applied to at least one of the two of the plurality of pads in the padset. In block 1506, an address at an n-bit decoder is set corresponding to at least one of the plurality of devices under test. In block 1508, an adjustable voltage is applied to the at least one of the plurality of devices under test. In block 1510, a parameter of the at least one device under test is measured at the at least one of the two of the plurality of pads in the padset. The methodology may also be repeated with a different voltage applied in step 1504 as that voltage is also capable of being adjusted.

For example, to measure Ion values of FETs in a 30 DUT nFET array all pads are first contacted to ground. VD=1.0V is applied to the source pad of the array. VC is set to –0.1V. The decoder address is set to 00001. VG is set to 1.0V. I(VC=–0.1V, VG=1.0V)=Ion(DUT1) is measured at source pad of the array. VG is set to 0.0V and the final steps are repeated for a different decoder address for DUTs 2-30.

As another example, to measure Ioff values of FETs in a 30 DUT nFET array all pads is first connected to ground. Decoder address 00000 is asserted. VD=1.0V is applied to the source pad of the array. VC is set to –0.1V. I(VC=–0.1V)=I (00000) is measured at the source pad of array 1. Decoder address 11111 is asserted. I(11111) is measured at the source pad of array 1. η=I(00000)/I(11111) is calculated. The decoder address is set to 00001. I(VC=–0.1, VG=0) is measured at the source pad of the array. Ioff(DUT1)=[I(VC=–0.1, VG=0)–I(00000)]/(1–η) is calculated. The final steps are then repeated for a different decoder address for DUTs 2-30.

As a further example, to measure R values of contacts in a 30 DUT contact array all pads are first contacted to ground. VC is set to –0.1 V. Vdr=1.0V is applied to Vdr pad of the array. The decoder is set to address DUT30, which is a calibration "short" for all arrays. Current I(DUT30) is measured at Vdr pad of the array. Voltage Vo(DUT30) is measured at Vo pad of the array. Ground resistance is calculated as Rg=R(DUT30)=I(DUT30)/Vo(DUT30). The decoder is set to address DUT01. Current I(DUT01) is measured at Vdr pad of the array. Voltage Vo(DUT01) is measured at Vo pad of the array. R(DUT01)=[I(DUT01)/Vo(DUT01)]–Rg is calculated. The final steps are repeated for DUTs 2-29.

Concepts and implementations of the present invention have been described in 45 nm technology of M1 testable, multi-port, linear addressable arrays for FET and small resistance diagnostics. In the designs described 240 FETs or 180 contact structures with 8 or 6 groups of 30, respectively, are accommodated in a single minimum dimension 1×25 padset. Because each group is small and essentially an independent entity as far as the flow of significant currents is concerned, series voltage drops and parallel current paths are of minor concern compared to the situation with large two dimensional addressable arrays. The design is inherently multiport and especially well suited for rapid measurement on a parallel tester. Migration to a larger padset is straightforward. For example four of the present 1×25 padset macros can trivially be mapped to a 2×50 padset to produce a 32 port FET array design. With a redesign that increases sharing of address bit and decoder Vdd pads a straightforward extension to 40 ports with 1200 FET DUTs may be achieved, all in a 160 um by 5 mm (or less) macro. A proportionate increase of R(CA) DUTs can also be realized. While these numbers are still small compared to what can be achieved with M4 testable arrays, they represent an enormous improvement over using individual wired out DUTs in multiple dedicated macros and are also a factor of >20 more effective in terms of DUTs/mm² than the two dimensional M1 testable design.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An integrated circuit device comprising:
a padset having a plurality of pads;
one or more arrays of devices under test, each of the one or more arrays disposed between and electrically coupled to two of the plurality of pads;
one or more n-bit decoders, each disposed between two of the plurality of pads and electrically coupled to a corresponding one of the one or more arrays, wherein each n-bit decoder comprises one or more outputs that deliver an adjustable voltage to each device under test in the corresponding one of the one or more arrays of devices under test as a function of an address supplied to the n-bit decoder;

wherein the integrated circuit device and corresponding electrical connections are implemented in a single level of metal.

2. The integrated circuit device of claim 1, further comprising source and drain buses shared by the devices under test in each of the one or more arrays in the single level of metal, wherein the two of the plurality of pads between which each of the one or more arrays are disposed comprise a source pad electrically coupled to the source bus, and a drain pad electrically coupled to the drain bus.

3. The integrated circuit device of claim 1, wherein the corresponding electrical connections comprise at least one crossover of at least one of silicided diffusion and polysilicon.

4. The integrated circuit device of claim 1, further comprising a positive voltage supply bus that powers the one or more n-bit decoders in the single level of metal, wherein the voltage supply bus runs along a side of the padset.

5. The integrated circuit device of claim 4, further comprising at least one adjustable voltage bus electrically coupled to the n-bit decoder and devices under test of at least one of the one or more arrays for delivery of at least one defined voltage to one or more of the devices under test of the one or more arrays in the single level of metal implementation.

6. The integrated circuit device of claim 5, wherein each device under test comprises at least one of a negative channel field effect transistor and a positive channel field effect transistor.

7. The integrated circuit device of claim 6, wherein the at least one adjustable voltage bus comprises two adjustable voltage buses that run along a side of the padset opposite that of the positive voltage supply bus.

8. The integrated circuit device of claim 6, wherein the one or more arrays comprise 8 arrays of thirty devices under test.

9. The integrated circuit of claim 5, wherein each device under test comprises a resistive element.

10. The integrated circuit device of claim 9, wherein the at least one adjustable voltage bus comprises a single adjustable voltage bus that runs along a side of the padset opposite that of the positive voltage supply bus.

11. The integrated circuit device of claim 9, wherein the one or more arrays comprise 6 arrays of thirty devices under test.

12. The integrated circuit device of claim 9, wherein the contact structure comprises at least one of a metal short, a wire segment, two metal-to-silicon contacts in series, and a single metal-to-silicon contact.

13. The integrated circuit device of claim 12, further comprising a plurality of select circuits driven by the one or more outputs of the n-bit decoder to deliver the defined voltage to the devices under test via the at least one adjustable voltage bus.

14. The integrated circuit device of claim 5, wherein each device under test is assigned a binary address for delivery of the defined voltage from the n-bit decoder.

15. The integrated circuit device of claim 1, further comprising n decoder bit lines electrically coupled to the n-bit decoder, wherein the n decoder bit lines run along a side of the padset.

16. The integrated circuit device of claim 15, wherein the n-bit decoder comprises a 5-bit decoder and the n decoder bit lines comprise 5 decoder bit lines.

17. The integrated circuit device of claim 1, wherein the n-bit decoder comprises high threshold voltages inverters and two-way NAND gates.

18. A method of characterizing device parameters of an integrated circuit device comprising the steps of:
contacting each of one or more arrays of devices under test to a corresponding ground, wherein each of the one or more arrays are disposed between and electrically coupled to two of a plurality of pads in a padset;
applying a drain voltage to at least one of the two of the plurality of pads in the padset;
setting an address at an n-bit decoder corresponding to at least one of the plurality of devices under test, wherein each n-bit decoder is disposed between the two of the plurality of pads in the padset and corresponds to one of the one or more arrays, and wherein the integrated circuit device and corresponding electrical connections are implemented in a single level of metal;
applying at least one adjustable voltage to the at least one of the plurality of devices under test; and
measuring a parameter of the at least one device under test at the at least one of the two of the plurality of pads in the padset.

19. The method of claim 18, further comprising the step of:
adjusting the drain voltage applied to at least one of the two of the plurality of pads in the pad set; and
repeating the steps of setting an address, applying at least one adjustable voltage, and measuring a parameter for the new adjusted drain voltage.

20. A method for making a computer implemented process to enable characterization of device parameters of an integrated circuit device comprising the steps of:
instantiating first computer instructions onto computer readable medium, the first computer instructions configured to contact each of one or more arrays of devices under test to a corresponding ground, wherein each of the one or more arrays are disposed between and electrically coupled to two of a plurality of pads in a padset;
instantiating second computer instructions onto a computer readable medium, the second computer instructions configured to apply a drain voltage to at least one of the two of the plurality of pads in the padset;
instantiating third computer instructions onto a computer readable medium, the third computer instructions configured to set an address at an n-bit decoder corresponding to at least one of the plurality of devices under test, wherein each n-bit decoder is disposed between the two of the plurality of pads in the padset and corresponds to one of the one or more arrays, and wherein the integrated circuit device and corresponding electrical connections are implemented in a single level of metal;
instantiating fourth computer instructions onto a computer readable medium, the fourth computer instructions configured to apply at least one adjustable voltage to the at least one of the plurality of devices under test; and
instantiating fifth computer instructions onto a computer readable medium, the fifth computer instructions configured to measure a parameter of the at least one device under test at the at least one of the two of the plurality of pads in the padset.

* * * * *